United States Patent [19]

Fairgrieve

[11] Patent Number: 5,898,334
[45] Date of Patent: Apr. 27, 1999

[54] REDUCED OUTPUT CAPACITANCE CIRCUIT FOR DRIVING A GROUNDED LOAD IN RESPONSE TO A STEPPED INPUT

[75] Inventor: Alexander Fairgrieve, Menlo Park, Calif.

[73] Assignee: Elantec Semiconductor, Inc., Milpitas, Calif.

[21] Appl. No.: 08/854,376

[22] Filed: May 12, 1997

[51] Int. Cl.$^6$ .................................................. H03K 17/62
[52] U.S. Cl. .............................. 37/411; 327/361; 327/413
[58] Field of Search ........................... 327/108–112, 170, 327/374–377, 434, 436, 437, 411–413, 355, 361; 369/48, 49

[56] References Cited

U.S. PATENT DOCUMENTS

| 4,239,989 | 12/1980 | Brajder | 327/412 |
| 4,686,674 | 8/1987 | Lam | 327/412 |

FOREIGN PATENT DOCUMENTS

| 56-87931 | 7/1981 | Japan | 327/411 |

*Primary Examiner*—Kenneth B. Wells
*Attorney, Agent, or Firm*—Fliesler, Dubb, Meyer & Lovejoy LLP

[57] ABSTRACT

A circuit for generating an output signal used for driving a grounded load is provided. The circuit provides an output signal without glitches or spikes. The circuit also outputs a drive signal with enhanced responsiveness in transitioning from one output value level to another output value level. The circuit includes a plurality of control devices for providing respective output signals responsive to respective control signals. The base of a PNP transistor is coupled to the output of the control devices and acts as a buffer. The emitter of the PNP transistor is coupled to a voltage source and the collector is coupled to a grounded load for providing the drive current. Alternatively, an NPN transistor and current source provides the drive current to the grounded load. The circuitry may be used in an optical disk drive with the load and ground being a laser diode used for providing a laser beam in reading/writing an optical disk.

28 Claims, 5 Drawing Sheets

REDUCED OUTPUT CAPACITANCE CIRCUIT FOR DRIVING A GROUNDED LOAD IN RESPONSE TO A STEPPED INPUT

BACKGROUND OF THE INVENTION

1. Field of the Invention

The present invention is generally related to a circuit for driving a grounded load.

2. Description of the Related Art

Many electrical applications require a circuit for driving a signal into a grounded load. The output signal from such a circuit can vary in frequency and amplitude, and may contain a broad spectrum of frequencies and amplitudes depending upon the application. Often, the output signal must quickly transition or step from one level or value to another level or value. This transitioning from one value to another may be accomplished by using a fast Digital-to-Analog Converter ("DAC"). For example, a DAC 10 having N input lines 11, as shown in FIG. 1, could be used to provide an output signal at $2^N$ different values. In response to input signals on lines 11, an output signal from DAC 10 is generated on line 14 to drive load 12 coupled to the ground 13.

However, using a DAC will produce glitches or spikes in the output signal when transitioning between values as illustrated by dotted curve 21 in FIG. 2. The output signal during transitioning can briefly be some other value (for example a higher value 21b or lower value 21a) than either the value at level one or the value at level two. Curve 20 in FIG. 1 illustrates a preferred output signal transitioning from one value to a second value. The glitches, as illustrated by dotted curve 21, are caused by DAC 10's unequal switching delays for digital inputs on lines 11. These glitches may introduce a greater amount of signal into a particular load 12 than is desirable or specified. This increased signal may unduly stress the load and eventually cause a premature failure of the load.

One way of eliminating the glitches in an output signal includes using a circuit 39, as shown in FIG. 3, which provides one output signal to load 34 from one control device at a time. The plurality of output signals from the respective N control devices are effectively summed on line 33 to obtain the maximum required output signal used in driving load 34. Input signals to circuits 39 are generated on lines 30a–Na to control devices 30–N, respectively. Control devices 30–N are controlled on or off by control signals on control lines 30b–Nb. Control signals on lines 30b–Nb are generated such that only one control device is switched on or off at a time. While circuit 39 eliminates glitches, the output capacitance as observed by load 34 is substantially higher than optimal because some of the N control devices may not be turned on when generating a predetermined output signal. This increased output capacitance increases the response time necessary in transitioning from one output value to another output value. A further disadvantage in using circuit 39 is that a predetermined output signal required in driving load 34 may be much less than the theoretical sum of the respective output signals from the N control devices. In other words, more total output signal capacity is available in circuit 39 than is actually required for driving load 34.

Therefore, it is desirable to have a circuit for driving a grounded load which does not generate output signal glitches when transitioning from one output value to another output value. Further, it is desirable to have circuit with reduced output capacitance thereby improving the response time in stepping from one output value to another output value. The circuit should also efficiently generate the required output signal levels and minimize power consumption.

SUMMARY OF THE INVENTION

A circuit is provided which reduces glitches during the transitioning from one output signal value to another output signal value. The circuit is also able to provide faster output signal response times due to reduced output capacitance. The circuit comprises a first control device for providing a first signal responsive to a first control signal. A second control device provides a second signal responsive to a second control signal. A switch is coupled to a voltage source, the first control device and the second control device. The switch is also coupled to a load which is coupled to a ground. The switch provides an output signal for driving the load responsive to the first and second signals.

According to another advantage of the present invention, a third control device provides a third signal responsive to a third control signal. The third control device is likewise coupled to the switch.

According to another aspect of the present invention, the switch is a bipolar transistor. The bipolar transistor may be a PNP transistor having a base, emitter and collector.

According to another aspect of the present invention, the switch is a Positive Metal Oxide Semiconductor ("PMOS") transistor.

According to another aspect of the present invention, the load and ground is a laser diode and the circuit is used in an optical disk drive.

According to another aspect of the present invention, a controller is coupled to first and second control devices for providing the first and second control signals.

According to another aspect of the present invention, a circuit comprises a first control device which provides a first signal responsive to a first control signal and a second control device which provides a second signal responsive to a second control signal. A load is coupled to a current source and a ground. A switch is coupled to the first control device, the second control device, the current source, and the ground. The switch provides an output signal to the load responsive to the first and second signals.

According to another aspect of the present invention, the switch is a bipolar transistor. The bipolar transistor may be a NPN transistor having a base, emitter and collector. The NPN transistor base is coupled to the first and second control device. The NPN emitter is coupled to the ground. The NMOS collector is coupled to the current source.

According to another aspect of the present invention, the switch is a Negative Metal Oxide Semiconductor ("NMOS") transistor.

According to another aspect of the present invention, an optical disk drive having a drive circuit according to the present invention is provided. The optical disk drive comprises a first transistor for providing a first current signal responsive to a first control signal. A second transistor provides a second current signal responsive to a second control signal. A controller is coupled to the first and second transistors and provides the first and second control signals. A control bipolar transistor is coupled to the first and second transistors and provides a drive current responsive to the first and second current signals. A laser diode is coupled to the control transistor and generates a laser beam responsive to the drive current.

3

Other aspects and advantages of the present invention can be seen upon review of the figures, the detailed description, and the claims which follow.

DETAILED DESCRIPTION OF THE INVENTION

Figure 4:
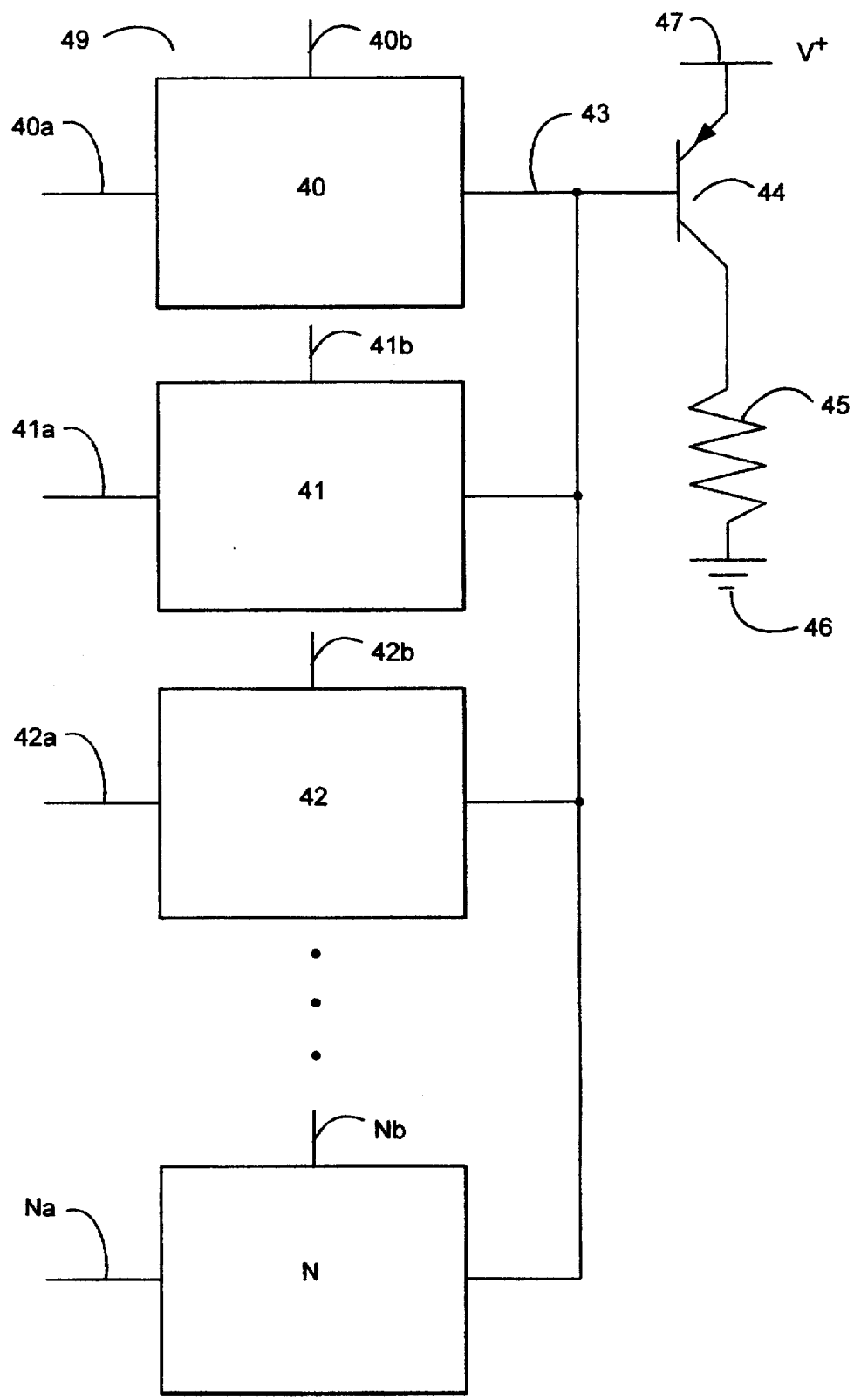
FIG. 4 is a schematic illustrating a PNP transistor used to provide an output signal in driving a grounded load according to the present invention.

FIG. 4 illustrates a circuit 49 for driving a grounded load according to the present invention. Circuit 49 offers the advantage of substantially reducing the glitches or signal spikes, illustrated by curve 21 in FIG. 2, when transitioning from a first output signal value to a second output signal value. In addition, circuit 49 reduces output signal response time when transitioning from the first output value to the second output value.

Circuit 49 includes a plurality of control devices 40, 41, and 42–N. Each control device includes a current input line and a control line. For example, control device 40 includes current line 40a and control line 40b. Likewise, control devices 41–N have respective current lines 41a–Na and respective control lines 41b–Nb. Current is supplied to the control devices on a current line, such as current line 41a. The output of current to line 43 from control devices 40–N is controlled by signals on control lines, such as control line 40b.

Control signals on control lines 40b–Nb determine whether the current supplied on current lines 40a–Na is passed through control devices 40–N and output to line 43. In an embodiment, control lines 40b–Nb may be connected to a microprocessor or controller generating the signals to control the switching on or off of control devices 40–N.

In an embodiment, control devices 40–N may each include a transistor for allowing the current on current lines 40a–Na to pass to line 43. The respective transistors may be controlled by the respective control lines 40b–Nb. In an embodiment, the respective transistors may be bipolar transistors having either PNP or NPN technology. In an alternate embodiment, transistors in control devices 40–N are Complementary Metal Oxide Semiconductor ("CMOS") transistors. In an alternate embodiment, control devices 40–N may also include respective amplifiers for amplifying the current on current lines 40a–Na.

Figure 5:
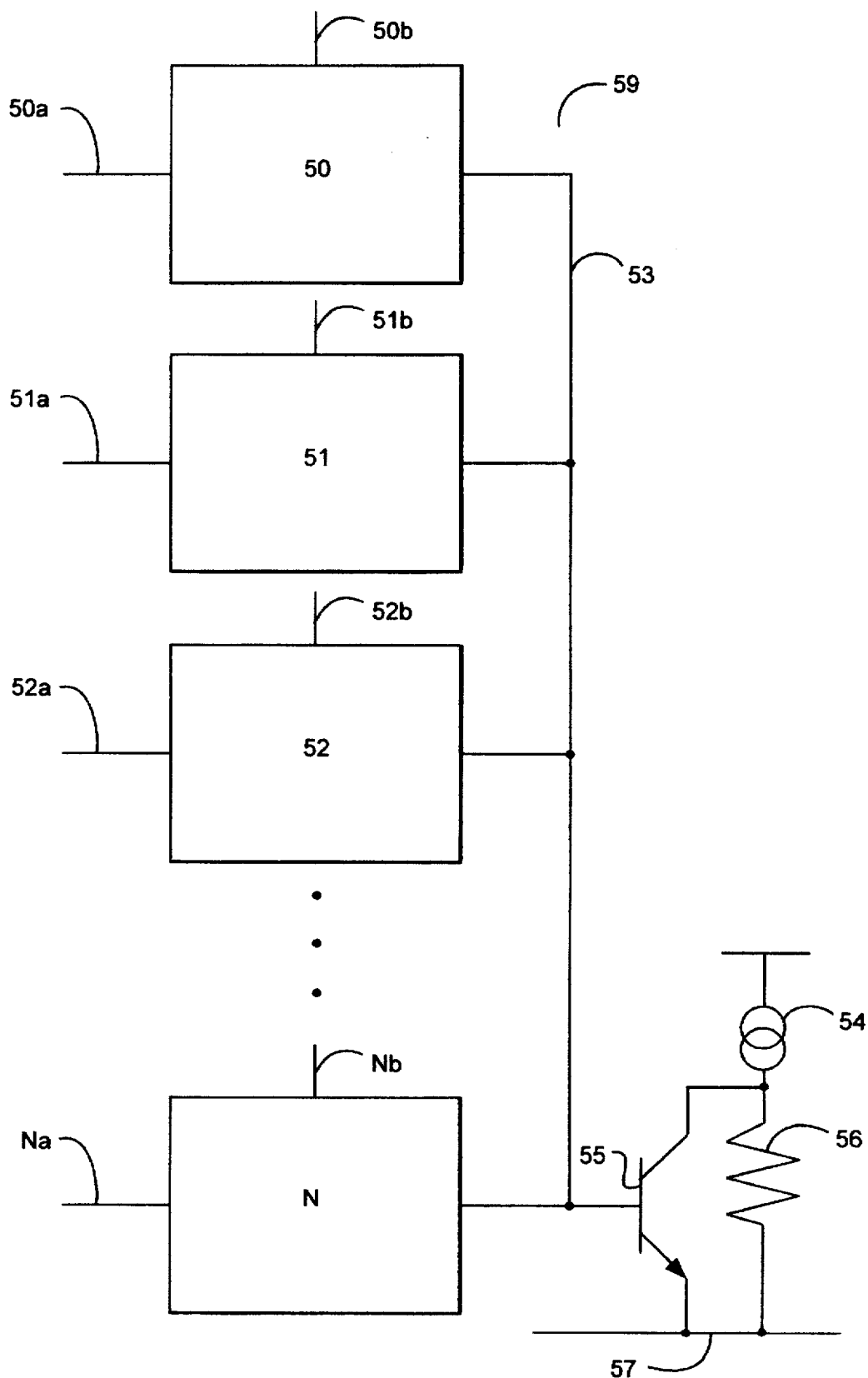
FIG. 5 is a schematic illustrating an NPN transistor used to provide an output signal in driving a grounded load according to the present invention.

Current is output from control devices 40–N on line 43, which is coupled to the base of transistor 44. In the preferred embodiment, transistor 44 is a PNP transistor. The emitter of transistor 44 is connected to voltage line 47, supplying voltage $V^+$. The collector of transistor 44 is connected to load 45, which is connected to ground 46. In alternate embodiments, transistor 44 may be a NPN transistor as illustrated in FIG. 5. The voltage $V^+$ supplied on line 47 is sufficient to allow for driving the maximum current necessary into load 45.

Figure 1:
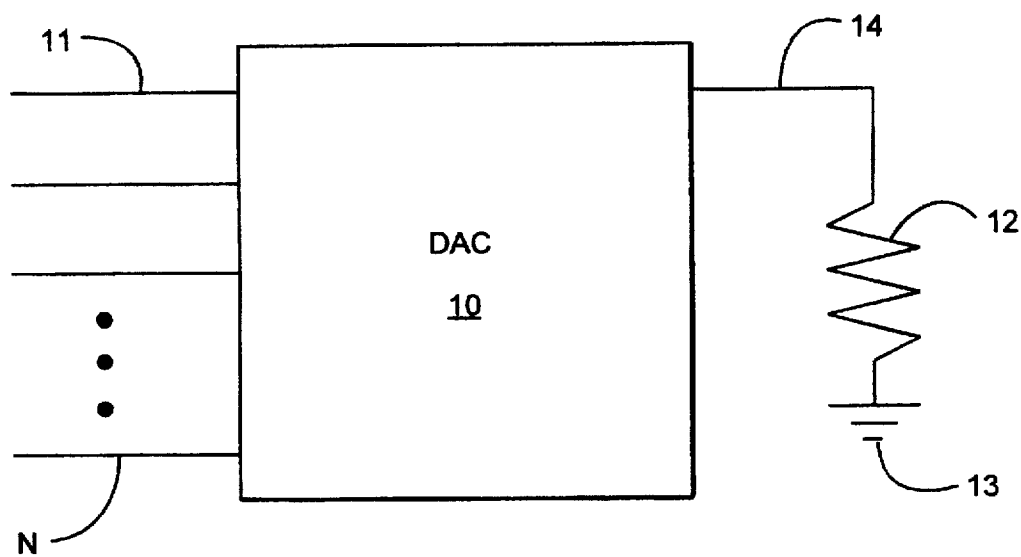
FIG. 1 illustrates a prior art Digital-to-Analog Converter (DAC) for providing an output signal used to drive a grounded load.
Figure 2:
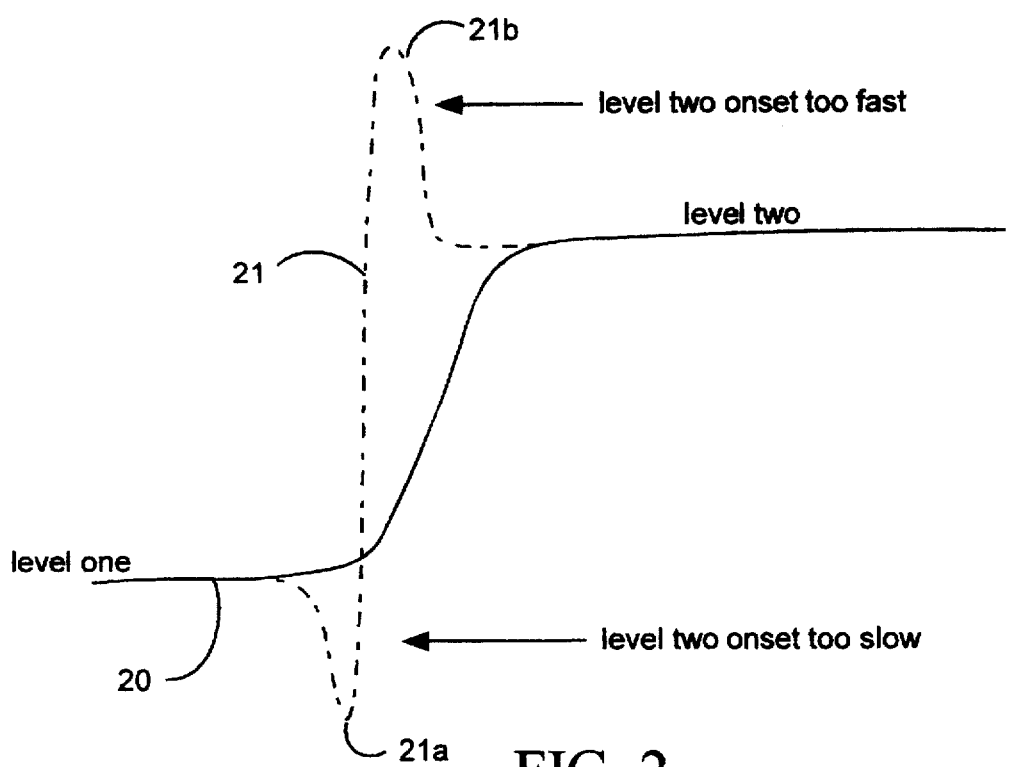
FIG. 2 illustrates an output signal having glitches created when using the DAC illustrated in FIG. 1 and an idealized output signal.

As described above, using transistor 44 enables the glitches as illustrated by curve 21 in FIG. 2 to be substantially reduced when driving load 45 from a first signal level to a second signal level. Transistor 44 acts as a buffer enabling a smooth and relatively fast transition from a first output signal level to a second output signal level as illustrated by curve 20 in FIG. 2. Using a single transistor 44 to provide a current path to load 45 enables a selection of an optimized transistor 44 size for providing the specified current to load 45. Transistors used in control devices 30–N must be relatively larger to accommodate the summed current on line 33 from control devices 30–N. Further, using a relatively smaller transistor 44 results in an output with a higher impedance enabling relatively faster switching of current levels to load 45 than using the respective transistors in control devices 30–N as shown in FIG. 3.

Figure 3:
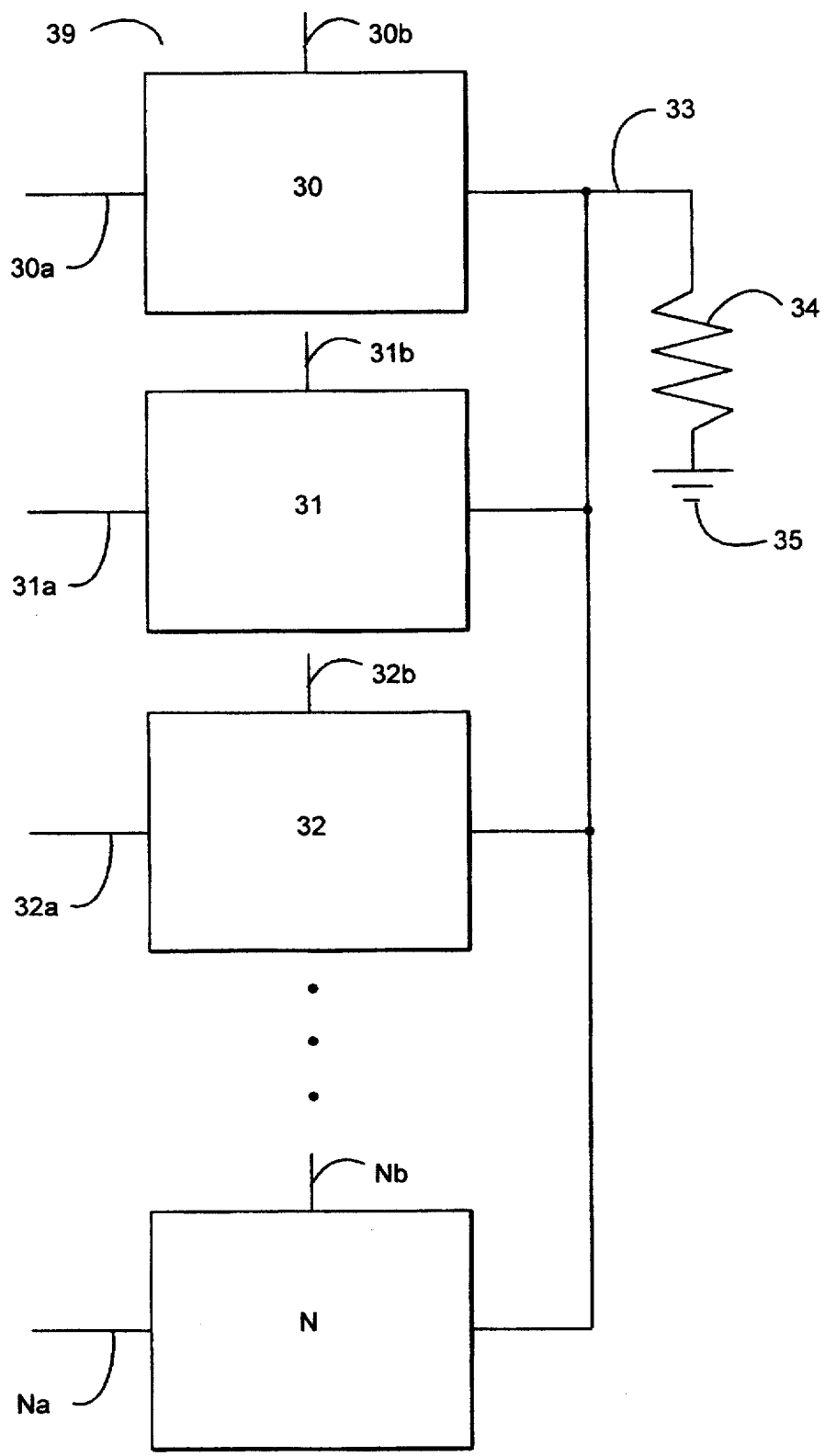
FIG. 3 illustrates a plurality of control devices for providing an output signal used to drive a grounded load.

Another significant disadvantage of circuit 39 shown in FIG. 3 is that each transistor in control device 30–N must turn on and completely off, which requires charging and discharging the capacitances of the respective transistors. Therefore the transistors in control device 30–N are required to operate over a range of bias values that results in slower switching than a transistor that remains close to the transistor's optimum bias value (for speed) during switching. The use of a single transistor, such as transistor 44 as shown in FIG. 4, means that instead of turning a transistor on and off, transistor 44 moves from one on-state to another on-state, requiring far less capacitor charging, which in turn enables the current driving load 45 to transition from a first current level to a second current level faster.

With transistor 44 merely moving between various on-states, the applied signal at the base of transistor 44 need not be restricted to just stepping between different levels, but may include the complete spectrum of frequency and amplitude, so long as the sum of all these signals keeps transistor 44 near the optimum bias value. In alternate embodiments, the signal applied to the base of transistor 44 is a sinusoid signal rather than a step signal, and so a combination of DC levels and other signal types may be combined.

In an alternate embodiment, an active or passive component, such as a resistor or transistor, may be coupled between line 43 and voltage line 47 to control the gain of transistor 44.

FIG. 5 illustrates another embodiment of the present invention. Circuit 59 illustrates a similar circuit structure illustrated in FIG. 4. However, circuit 59 utilizes a NPN technology transistor 55 and current source 54. Control devices 50, 51, and 52–N are used to control the current supplied to the base of transistor 55. Current input lines 50a, 51a, and 52a–Na are used to input current to the control devices. Likewise, control lines 50b, 51b, and 52b–Nb are used to control the amount of current output on line 53 to the base of transistor 55.

A current source 54 is connected to a load 56 which is connected to ground 57. Current source 54 is selected to provide at least the maximum required current to drive load 56. Transistor 55 is also connected to current source 54 and ground line 57. In particular, the collector of NPN transistor 55 is connected to current source 54 and the emitter of transistor 55 is connected to ground 57.

Accordingly, the current applied to the base of transistor 55 controls the amount of a current driving load 56 and has the similar advantages above in regard to circuit 49 illustrated in FIG. 4. However, circuit 59 requires more power consumption since current source 54 must provide a current signal into load 56, which is at least as high as the maximum current required to drive load 56.

Figure 6:
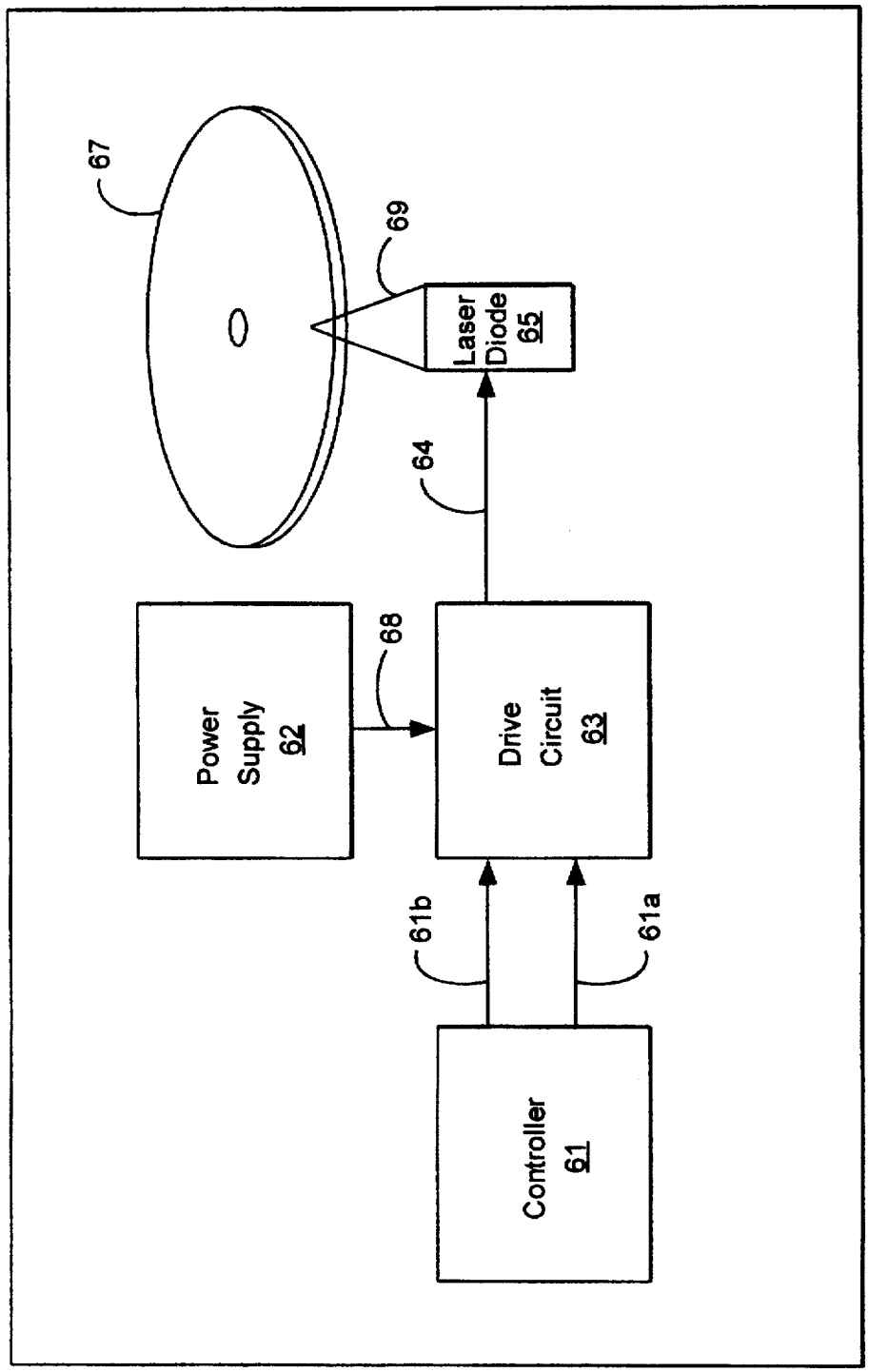
FIG. 6 illustrates an optical disk drive having a drive circuit according to the present invention.

In an embodiment, circuit 49 may be used in an optical disk drive and load 45 and ground 46 may be a laser diode for providing a laser beam used in the optical disk drive. FIG. 6 illustrates an optical disk drive 60 having a drive circuit 63 according to the present invention. Optical disk drive 60 includes a controller 61 coupled to drive circuit 63. Control and current signals may be generated on line 61a–b to drive circuit 63. Power supply 62 supplies power to drive circuit 63 on line 68. Drive circuit 63 then drives laser diode 65 by generating a current signal on line 64. In an embodiment, drive circuit 63 may be circuit 49 or 59 illustrated in FIGS. 4 or 5, respectively. Laser diode 65 generates a laser beam 69 for reading and/or writing optical information from and/or to optical disk 67. It should be understood by one of ordinary skill in the art, that only major components of optical disk drive 60 are illustrated in FIG. 6. Many other components which are not necessary in illustrating the present invention may be included in optical drive 60. Typically, the laser diode 65 emits a laser beam 69 having a wavelength from approximately 635 to 850 nm. Further, in an optical disk drive embodiment, three to five control devices may be used in generating three to five output signal levels applied to laser diode 65. In this laser diode embodiment, any output signal spikes or glitches illustrated by curve 21 in FIG. 2 would unduly stress the laser diode. This increased stress would eventually lead to premature failure and shorten the life of the laser diode. Typically, output signal spikes which are greater than approximately 10% above a specified signal level will unduly stress the laser diode.

The foregoing description of the preferred embodiments of the present invention has been provided for the purposes of illustration and description. For example, an embodiment using the drive circuit in an optical disk drive has been provided. This embodiment is not intended to be exhaustive or to limit the invention. Obviously, many modifications and variations will be apparent to practitioners skilled in the art in using the drive circuitry. The embodiments were chosen and described in order to best explain the principles of the invention as practical applications, thereby enabling others skilled in the art to understand the inventions for various embodiments and with the various modifications as are suited to the particular use contemplated. It is intended that the scope of the invention be defined by the following claims and their equivalents.

What is claimed is:

1. A circuit, comprising:
   a first control device for providing a first signal responsive to a first control signal;
   a second control device for providing a second signal responsive to a second control signal;
   a voltage source;
   a ground;
   a load coupled to the ground; and
   a switch, coupled to 1) the first control device, 2) the second control device, 3) the voltage source, and 4) the load, for providing an output signal to the load responsive to the summation of the first and second signals.

2. The circuit of claim 1, further comprising a third control device, coupled to the switch, for providing a third signal responsive to a third control signal.

3. The circuit of claim 1, wherein the switch is a bipolar transistor.

4. The circuit of claim 3, wherein the bipolar transistor is a PNP transistor having a base, emitter and collector.

5. The circuit of claim 1, wherein the first control device is a bipolar transistor.

6. The circuit of claim 1, wherein the first control device is a CMOS device.

7. The circuit of claim 4, wherein the PNP transistor base is coupled to the first and second control devices, the PNP emitter is coupled to the voltage source, and the PNP collector is coupled to the load.

8. The circuit of claim 1, wherein the load and ground is a laser diode for providing a laser beam.

9. The circuit of claim 1, wherein the circuit is used in an optical disk drive.

10. The circuit of claim 1, further comprising a controller, coupled to the first and second control devices for providing the first and second control signals.

11. The circuit of claim 1, wherein the output signal exhibits reduced capacitor charging time delay in responding to the input signal due to reduced output capacitance.

12. The circuit of claim 1, wherein the output signal transitions from a first value to a second value with fewer glitches due to the common coupling of the first and second control devices with the switch.

13. A circuit, comprising:
   a first control device for providing a first signal responsive to a first control signal;
   a second control device for providing a second signal responsive to a second control signal;
   a ground;
   a current source;
   a load coupled to the current source and the ground; and
   a switch, coupled to 1) the first control device, 2) the second control device, 3) the current source, and 4) the load, for providing an output signal to the load responsive to the summation of the first and second signals.

14. The circuit of claim 13, further comprising a third control device, coupled to the switch, for providing a third signal responsive to a third control signal.

15. The circuit of claim 13, wherein the switch is a bipolar transistor.

16. The circuit of claim 15, wherein the bipolar transistor is an NPN transistor having a base, emitter and collector.

17. The circuit of claim 16, wherein the NPN transistor base is coupled to the first and second control devices, the NPN emitter is coupled to the ground, and the NPN collector is coupled to the current source.

18. The circuit of claim 13, wherein the load and ground is a laser diode for providing a laser beam.

19. The circuit of claim 13, wherein the first and second control devices are bipolar transistors.

20. The circuit of claim 13, wherein the first and second control devices are CMOS devices.

21. The circuit of claim 13, wherein the circuit is used in an optical disk drive.

22. The circuit of claim 13, further comprising a controller for providing the first and second control signals.

23. The circuit of claim 13, wherein the output signal has improved responsiveness due to reduced capacitance.

24. The circuit of claim 13, wherein the output signal transitions from a first value to a second value while reducing glitches.

25. An optical disk drive, comprising:
   a first transistor for providing a first current signal responsive to a first control signal;

a second transistor for providing a second current signal responsive to a second control signal;

a controller, coupled to the first and second transistors, for providing the first and second control signals;

a control bipolar transistor, coupled to the first and second transistors, for providing a drive current responsive to the first and second current signals; and, a laser diode, coupled to the control bipolar transistor, for generating a laser beam responsive to the drive current.

26. The optical drive of claim 25, wherein the control bipolar transistor is a bipolar PNP transistor coupled to a voltage source.

27. The optical drive of claim 25, wherein the control transistor is a NPN transistor coupled to a current source.

28. The optical drive of claim 25, wherein the first and second transistors are PNP transistors.

* * * * *